(12) United States Patent
Mallikarjunaswamy

(10) Patent No.: US 6,818,950 B1
(45) Date of Patent: Nov. 16, 2004

(54) INCREASING SWITCHING SPEED OF GEOMETRIC CONSTRUCTION GATE MOSFET STRUCTURES

(75) Inventor: Shekar Mallikarjunaswamy, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 31 days.

(21) Appl. No.: 10/438,034

(22) Filed: May 13, 2003

(51) Int. Cl.$^7$ .......................... H01L 29/76; H01L 29/94
(52) U.S. Cl. ................. 257/340; 257/341; 257/374; 257/389; 257/395; 257/396; 257/397; 257/401; 257/410
(58) Field of Search ................................. 257/340, 341, 257/374, 389, 395, 396, 397, 401, 410, 409

(56) References Cited

U.S. PATENT DOCUMENTS 5,561,319 A * 10/1996 Owens et al. ............... 257/649
6,072,216 A * 6/2000 Williams et al. ............ 257/339

* cited by examiner

Primary Examiner—Minhloan Tran
Assistant Examiner—Tan Tran
(74) Attorney, Agent, or Firm—J. Vincent Tortolano; Eugene H. Valet

(57) ABSTRACT

In cellular MOSFET transistor arrays using a geometric gate construction, deleterious inherent capacitance induced by the construction is substantially reduced by the use of plugs in between adjacent source regions of transistor source rows and adjacent drain regions of transistor drain rows of the array. Embodiments using field oxide, thicker step gate oxide, dielectric materials in a floating gate construction, and shallow trench isolation region plugs are described.

18 Claims, 3 Drawing Sheets

INCREASING SWITCHING SPEED OF GEOMETRIC CONSTRUCTION GATE MOSFET STRUCTURES

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO AN APPENDIX

Not applicable.

BACKGROUND

1. Technical Field

This disclosure relates generally to integrated circuits ("IC," also referred to hereinafter as "chip(s)") and more particularly to arrayed, or cellular, metal-oxide-semiconductor (MOS) transistors, also commonly known in the art as MOSFETs (metal-oxide-semiconductor field-effect transistor(s)).

2. Description of Related Art

FIG. 1 (Prior Art) schematically illustrates an elevation view taken in a cross-section through a small region of a conventional, multi-element, n-channel, lateral MOSFET array integrated circuit. MOS and complementary metal oxide silicon ("CMOS") device fabrication technology is a preferred process for many integrated circuit devices, particularly those in which low power consumption and high component density are priorities. Many publications describe the details of common techniques used in chip fabrication that can be generally employed in the manufacture of complex, three-dimensional, IC structures, including the present invention; see e.g., "Silicon Processes," Vol. 1–3, copyright 1995, Lattice Press, Lattice Semiconductor Corporation, Hillsboro, Oreg., or "VLSI Technology," McGraw-Hill, 1988. Moreover, the individual steps of such processes can be performed using commercially available IC fabrication machines. The use of such machines and conventional fabrication step techniques will be referred to hereinafter as simply: "in a known manner." As specifically helpful to an understanding of the present invention, approximate technical data are disclosed herein based upon current technology; future developments in this art may call for appropriate adjustments as would be apparent to one skilled in the art. Therefore no further explanation, other than that specifically provided herein, is necessary for an understanding for those persons skilled in the art. It should also be recognized by those skilled in the art that the specific embodiment descriptions herein are exemplary of the art and the invention and that instead of conductivity types described, complimentary types can be employed in each case, changing the polarity of the device, e.g., respectively exchanging p-type ion (e.g., boron) doping for n-type ion (e.g., phosphorus) doping. No limitation on the scope of the invention is intended by the inventors by use of these exemplary embodiments and none should be implied therefrom.

Using for example 1.2 micron fabrication technology rules, each MOSFET of an array structure 100, is constructed on a doped (approximately 5–20 ohm-cm) p-type substrate 101 (approximately 500 micron thick). Generally there is formed a buried isolation (ISO) layer 103 (approximately 10–15 micron thick; doping factor of approximately $1E^{18}/cm^2$) separating the substrate 101 from a superjacent epitaxial layer (approximately 7–10 microns thick) of the structure 100, where a P-type buried layer is used for isolation or parasitic NPN transistor suppression, a N-type buried layer is uses for parasitic PNP bipolar transistor suppression. Superjacent the buried ISO layer 103 is a lightly doped, P–, well 105 (approximately 3–4 microns thick; doping factor of approximately $2E^{18}/cm^3$) in which the active elements of the IC are formed. Each conventional MOSFET arrayed in the epitaxial layer includes a source ("S") and drain ("D") with an intervening channel region. A heavily doped, – type ion, poly-silicon gate ("G"; thickness approximately 5,000 Angstroms; doping factor of approximately $10^{21}/cm^3$) above the channel for turning the MOSFET on and off, each with appropriate electrical interconnects (often simply referred to as "metal$_1$," "metal$_2$," et seq. as appropriate to the particular implementation). A conventional gate oxide 113 (approximately 500 Angstrom thickness) intermediates the gates and the channel regions between source and drain regions of each MOSFET.

The elevation view depiction here is through a plane representative of a minute region of an IC, showing two adjacent MOSFET parts of a cellular array wherein the cross-section is in a plane through two adjacent, heavily doped (approximately $1E^{20}/cm^3$), N+, source or drain ("S/D") regions 107, 107a (approximately 0.35 micron thick). Source/drain electrical interconnect contacts 111, 111a, are provided, generally a metal deposited through vias in an upper chemical-vapor-deposition (CVD) oxide 115 layer (approximately one micron thick).

In such an IC array, it is known to form a large plurality (e.g, tens of thousands per square inch surface area) of MOSFETs. Particular design sets of such structures and processes for fabrication are described in U.S. Pat. No. 5,355,008 for a DIAMOND SHAPED GATE MESH FOR CELLULAR MOS TRANSISTOR ARRAYS, and U.S. Pat. No. 5,447,876, for a METHOD OF MAKING A DIAMOND SHAPED GATE MESH FOR CELLULAR MOS TRANSISTOR ARRAYS, assigned to the common assignee herein and incorporated by reference in their entireties. Said gate mesh forms a structure having a plurality of substantially identical openings, each of said opening approximating a predetermined geometric construction. In general, these structures have been found to be particularly suited to closed-cell power MOSFET arrays, constructed to achieve low specific resistance in that the poly-silicon gate structures are arranged as overlaying and interspersing the source regions and drain regions by forming geometric grid, or mesh, like gate structures in accordance with the predetermined chosen shape. It is convenient to describe the array by the shape of the poly-silicon gate structures 109, e.g., "diamond cellular structure," "hexagonal cellular structure," "propeller cellular structure," or the like—see also e.g., FIG. 2, described in detail hereinafter. Such gate structures are therefore referred to hereinafter as "geometric gate constructions" (GGC).

However, it has been found that the geometric gate constructions may result in increased gate to source and drain capacitance—that is, an increased inherent capacitance between the poly-silicon gate fingers forming the mesh and the epitaxial layer, P– well, of the silicon. Such an additional gate to source and drain capacitance. lowers the switching speed of the device.

BRIEF SUMMARY

The basic aspects of the invention generally provide for processes and structures which increase switching speed of geometric gate construction MOSFETS.

As an exemplary embodiment, there is described a cellular metal-oxide-semiconductor structure having a plurality of individual field effect transistors, the structure including: a poly-silicon gate construction having a predetermined geometric mesh configuration; and subjacent each intersection of said mesh, a substantially insulative material plug inter-spaced between adjacent source regions and adjacent drain regions of said structure.

As another exemplary embodiment, there is described a MOSFET array including: a semiconductor material having a top surface; a plurality of lateral metal-oxide-semiconductor transistors in a cellular array configuration with respect to said top surface, each of said transistors including a first region of a geometric gate construction overlying and insulated from the top surface proximate a transistor channel region between a transistor source region and transistor drain region in said top surface, said gate construction forming a mesh having a plurality of substantially identical openings, each of said opening approximating a predetermined geometric shape; and subjacent each intersection of said mesh, each intersection forming a second region of the geometric gate construction overlying and insulated from the top surface proximate a third region of said top surface intervening adjacent source regions and adjacent drain regions of said transistors, an inherent capacitance-reducing plug.

As another exemplary embodiment, there is described a method for increasing switching speed in a MOSFET array wherein said array is associated with a semiconductor surface layer and includes a geometric gate construction fabricated of poly-silicon above said surface layer, the method including: locating each grid intersection of said geometric gate construction; and subjacent each said intersection, plugging a region separating adjacent MOSFET source regions and adjacent MOSFET drain regions of the array using a plug material for reducing capacitance between the poly-silicon forming the grid and said surface layer.

As yet another exemplary embodiment, there is described a cellular power MOSFET integrated circuit including: a semiconductor substrate having a first ion doping type; a surface layer of said substrate; in said surface layer, an active element a well having the first ion type doping, an array of MOSFETs including at least one row of source regions and at least one row of drain regions; superjacent said surface layer, a field isolation layer, having source and drain electrical connection vias therethrough, a poly-silicon geometric gate construction, said gate construction forming a grid having a plurality of substantially identical openings of a predetermined geometric shape and dimensions, a gate oxide layer separating said gate construction from said surface layer; and a capacitance-reducing plug at each intersection of said grid such that said plugs are inter-spaced between adjacent source regions of transistor source rows and adjacent drain regions of transistor drain rows of each row of the array.

The foregoing summary is not intended to be inclusive of all aspects, objects, advantages and features of the present invention nor should any limitation on the scope of the invention be implied therefrom. This Brief Summary is provided in accordance with the mandate of 37 C.F.R. 1.73 and M.P.E.P. 608.01(d) merely to apprise the public, and more especially those interested in the particular art to which the invention relates, of the nature of the invention in order to be of assistance in aiding ready understanding of the patent in future searches.

BRIEF DESCRIPTION OF THE DRAWINGS

FIGS. 2, 2A, and 2B, are illustrations in accordance with exemplary embodiments of the present invention in which:

FIG. 2 is an IC layout drawing, overhead view, for an exemplary embodiment,

FIG. 2A is a schematic, elevation view, taken along plane A—A, part 200, as shown in FIG. 2, and FIG. 2B is a different exemplary embodiment, schematic, elevation view, also taken along plane A—A, part 200, as shown in FIG. 2.

Like reference designations represent like features throughout the drawings. The drawings in this specification should be understood as not being drawn to scale unless specifically annotated as such.

DETAILED DESCRIPTION

Figure 1:
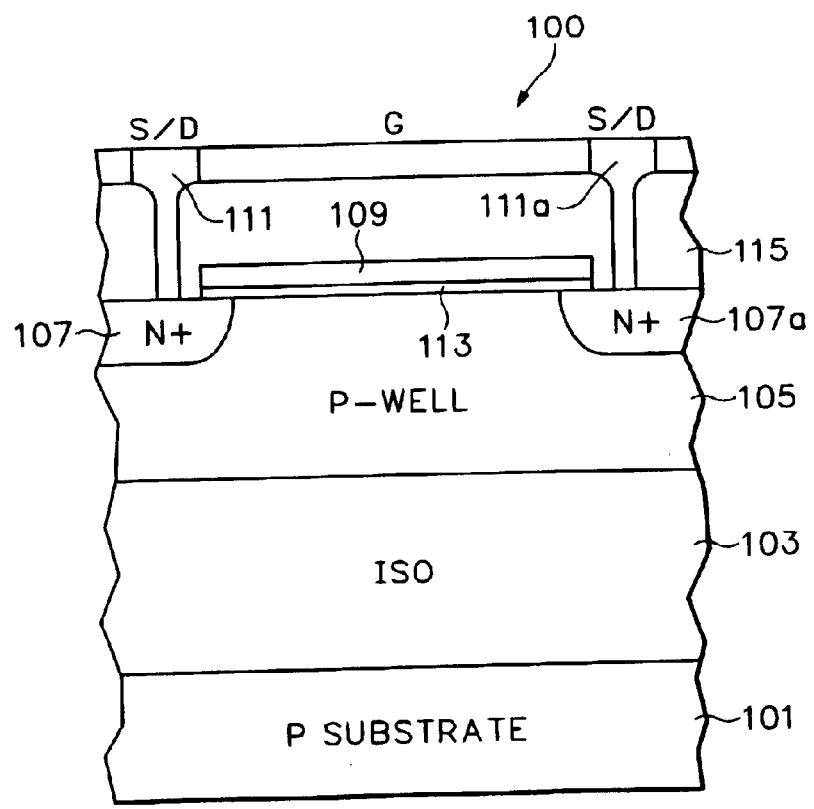
FIG. 1 (PRIOR ART) illustrates in a schematic, elevation view, a cross-section through a small region of a conventional, multi-element, n-channel MOSFET array integrated circuit.
Figure 2:
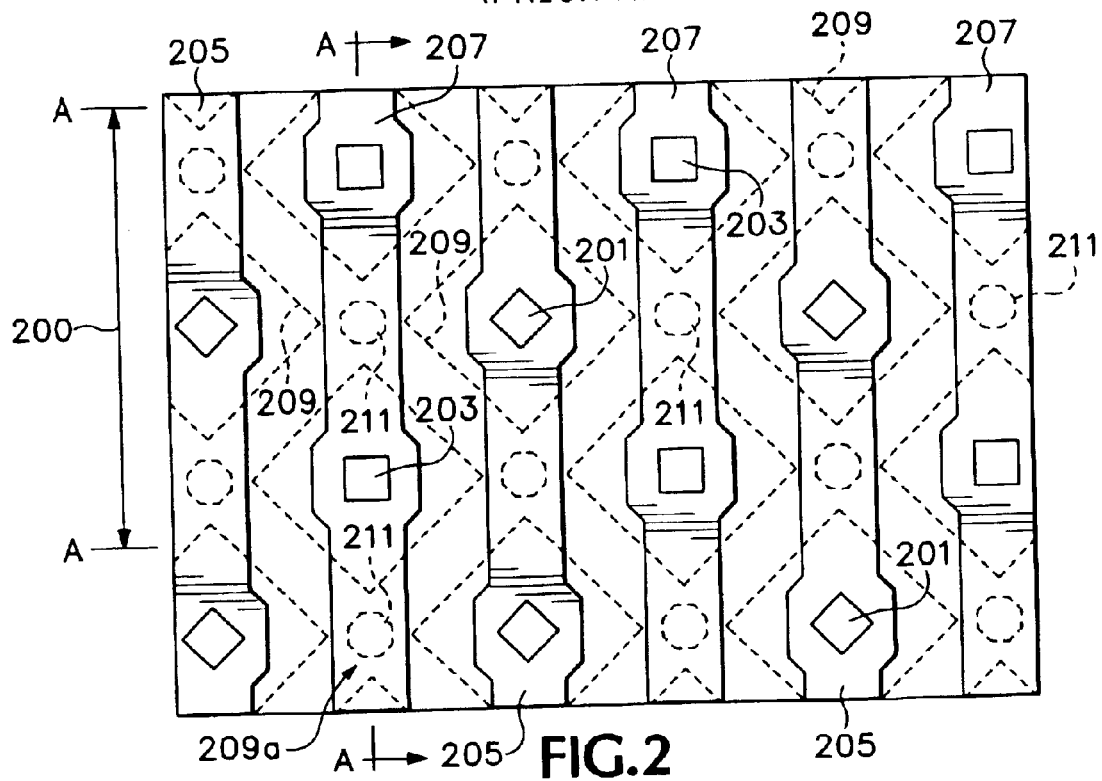

FIG. 2 in accordance an exemplary embodiment of the present invention is a schematic layout view of a minute region of a diamond (or square, depending on point-of-view) cellular structure, geometric gate construction, n-channel MOSFET array. Each relatively small, unshaded square shape is illustrative of a source, S, region 203. Each relatively small, unshaded diamond shape is illustrative of a drain, D, region 201. The vertical stripe regions are representative of respective drain interconnects 205 and source interconnects 207, each extending out to interconnect pads (not shown). The interwoven grid of phantom-line stripes, or fingers, are representative of a poly-silicon geometric gate construction 209, wherein the poly-silicon gate isolates the source and drain diffusions by forming said diamond cellular structure. As described in the Background section hereinbefore, this grid, or mesh, like structure may result in additional gate to drain and source capacitance at each intersection 209a of the GGC structure 209, and that capacitance lowers the device switching speed.

Figure 2A:
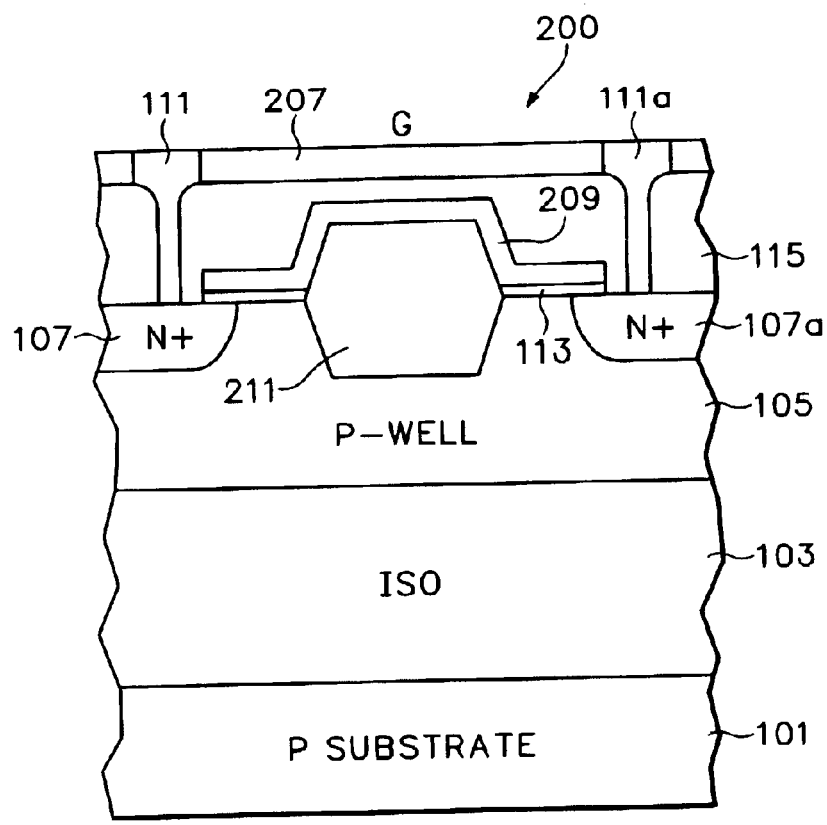

Turning also now to FIG. 2A, a schematic, elevation view, there is shown a cross-section taken in plane A—A, part 200, of FIG. 2. FIG. 4 depicts substantially the same embodiment in an perspective view. It has been found that the introduction of a substantially non-conducting, dielectric, "plug" 211 at each gate mesh intersection 209a decreases the problematical gate to drain and source capacitance during device operation. During IC fabrication, prior to the construction of the geometric gate construction structure 209 and in accordance with known manner fabrication processes, a field oxide plug 211 is grown between, and geometrically substantially co-extensive with, respective source regions and respective drain regions of adjacent MOSFETs of the array. In the preferred embodiment, the field oxide plug 211 extends subjacently from the gate oxide beneath the gate poly-silicon 209 into the P– well 105. Constructing a field oxide plug 211 as shown in FIGS. 2A and 4 to be approximately an order of magnitude thicker than the gate oxide 113, capacitance between the gate poly-silicon 209 and the P– well region 105 containing the source and drain regions 107, 107a may be substantially eliminated. Specific implementations may vary the geometric dimensions and shape of the plug 211 in order to maximize the capacitance reduction in accordance with the specific geometry of the MOSFETs being constructed, e.g., for multiple micron, 1-micron, 1.n-micron, submicron, or the like, channel length devices. In other words, as best seen in FIG. 2, the plug 211 may be given a predetermined (implementation-tailored) shape and dimensions that blocks the formation of a parasitic capacitor between adjacent sources and drains of the cellular array. In general, it has been found that having a plug with a diameter, or other cross-sectional dimension at the waist thereof, preferably is nominally the same measurement as the gate size, tailored to the specific implementation's fabrication design rules to account for geometric limitations. Resultant of the insertion of the plugs 211 and said reduced capacitance is a concomitant improvement in switching speed.

Figure 2B:
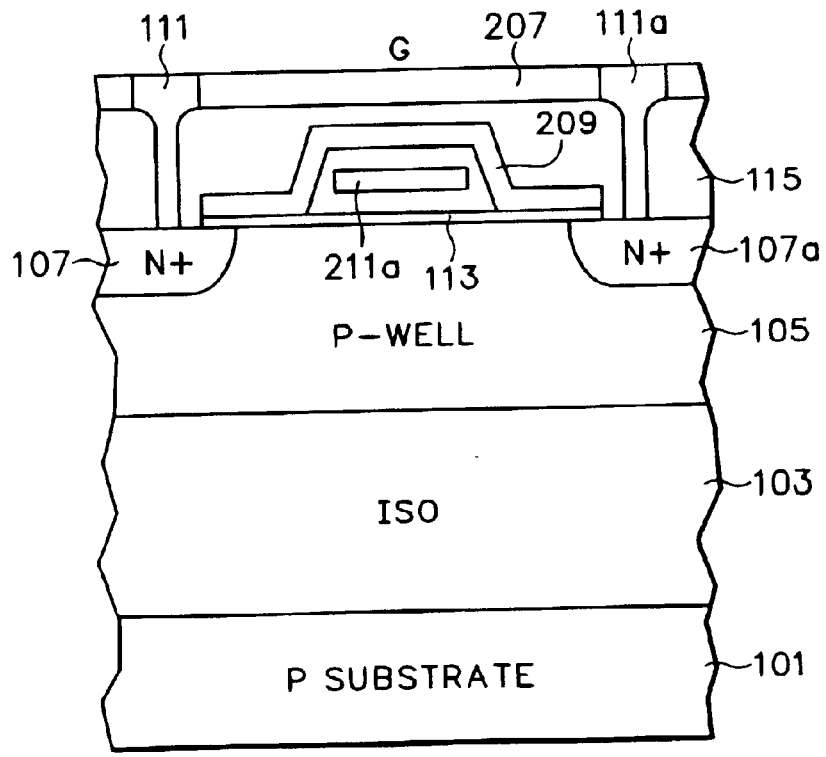

FIG. 2B is a schematic, elevation view, of another exemplary embodiment of the present invention. The plug 211a may be formed as a second, floating, poly-silicon layer embedded in the CVD oxide 115 after the formation of the gate oxide 113. In one exemplary embodiment, the second poly-silicon material plug 211a has a doping of approximately greater than or equal to $10^{21}/cm^3$ N+ doped (or P+ depending on the polarity implementation) whereas the gate poly-silicon 209 has a doping of approximately greater than or equal to $10^{21}/cm^3$ N+ doped. As another specific embodiment example, a nitride or other dielectric material may be substituted for the second poly-silicon material; other suitable dielectric materials currently known are silicon nitride, amorphous silicon, polyimide, silicide (e.g., cobalt or the like) or metal (e.g., aluminum, copper, titanium nitride, or the like). An insulator material plug is preferably thicker than a second, floating, poly-silicon material plug. It is preferred that an insulator material plug be at least twice as thick as the gate structure layer in order to maximize capacitance-reducing and concomitant switching speed increasing effects. As with the embodiment of FIG. 2A, the plug 211a in the embodiment of FIG. 2B will be geometrically shaped and dimensioned in conformity with the gate length and shape of the associated MOSFETs. Again, it has been found that this type of plug also decreases the capacitance between the gate region and respective source/drain regions, increasing switching speed.

Figure 3:
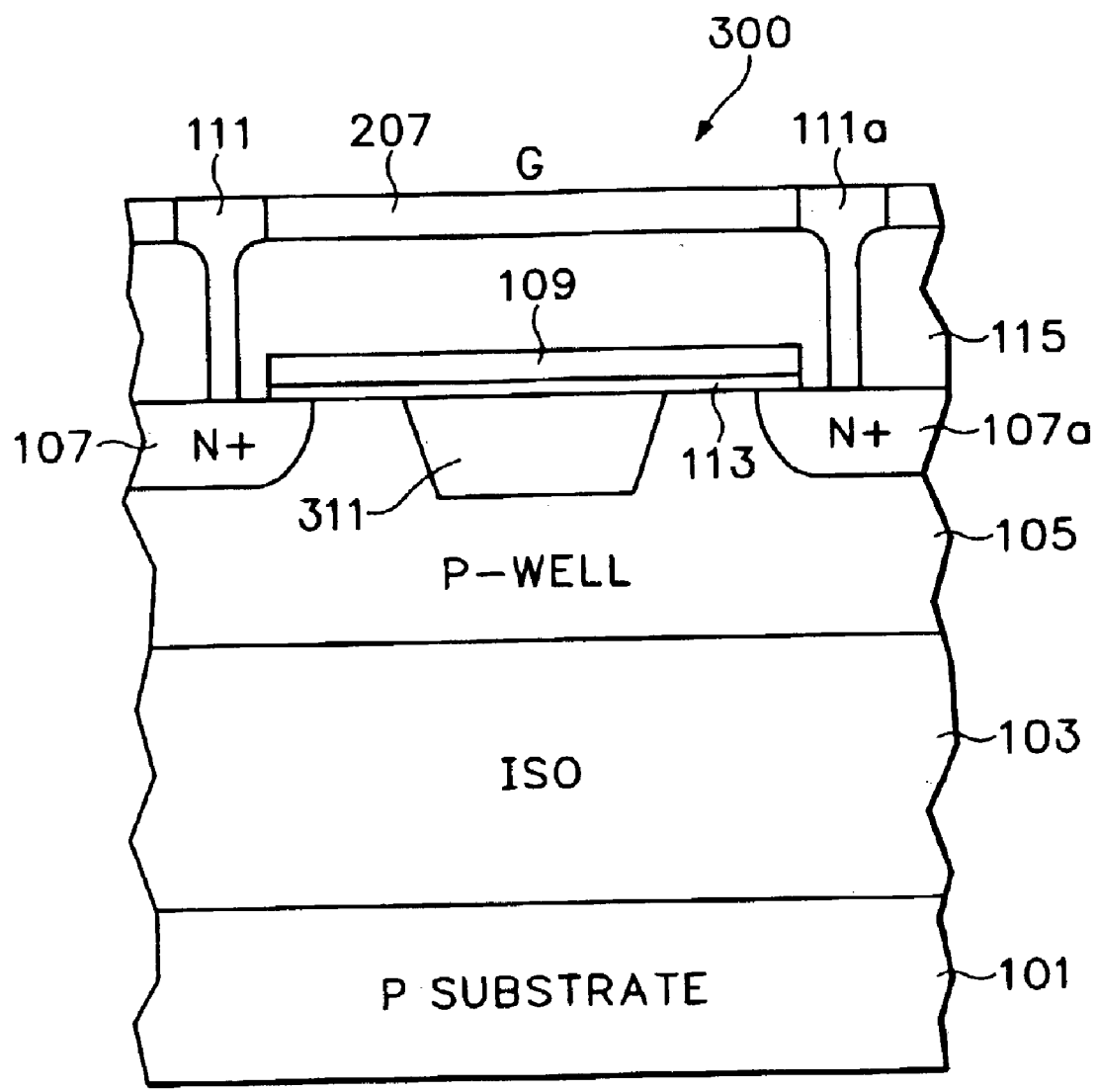
FIG. 3 is yet another embodiment, schematic, elevation view, illustrating an implementation of the invention as shown in FIG. 2 for a submicron CMOS or BiCMOS Device (BCD).

FIG. 3 is another exemplary embodiment of the present invention. Like FIGS. 2A and 2B, FIG. 3 is a schematic, elevation view, of a small cross-sectional region 300 of a MOSFET array taken in a similar plane A—A to that shown in FIG. 2. In sub-micron CMOS and BiCMOS processes, it is known that shallow trench isolation (STI) techniques have replaced local oxidation of silicon (LOCOS) device isolation techniques in order to enhance device packing density. Using the same STI techniques in known manner, in this embodiment of the present invention, an STI plug 311 for reducing capacitance between the gate region and respective source/drain regions is provided for cellular power MOSFET arrays. An etched, relatively shallow trench is filled with a dielectric material, e.g., an oxide, nitride, or like trench-filler material used in the current state of the art. Again, this has an effect of increasing the oxide thickness between the gate and P– well region, decreasing capacitance and improving switching characteristics.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art, particularly combinations of particular embodiments described hereinabove. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements during the term of the patent, and that adaptations in the future may take into consideration those advancements, in other word adaptations in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . ." and no method or process step herein is to be construed under those provisions unless the step, or steps, are expressly recited using the phrase "comprising the step(s) of . . . ."

What is claimed is:

1. A cellular metal-oxide-semiconductor structure having a plurality of individual field effect transistors, the structure comprising:
    a poly-silicon gate construction having a predetermined geometric mesh configuration: and
    subjacent each intersection of said mesh, a substantially insulative material plug inter-spaced between adjacent source regions and adjacent drain regions of said structure wherein each said plug is an insulative poly-silicon material layered in the field isolation layer between said gate structure and a surface of said structure containing source regions and drain regions therein.

2. The structure as set forth in claim 1 wherein each said plug is fabricated of a material for reducing capacitance between said gate structure and said source regions and said drain regions of said structure.

3. The structure as set forth in claim 1 wherein each said plug has a predetermined geometric shape and dimensions associated with gate length of each of said transistors.

4. The structure as set forth in claim 1 comprising:
    each said plug is a field oxide region having a thickness greater than gate oxide thickness for said transistors and extending from said gate structure into a substrate region so inter-spaced between adjacent source regions and adjacent drain of said structure.

5. The structure as set forth in claim 1 comprising:
    each said plug is a filled shallow trench isolation region extending into a surface of the structure containing source regions and drain regions therein.

6. A MOSFET array comprising:
    a semiconductor material having a top surface;
    a plurality of lateral metal-oxide-semiconductor transistors in a cellular array configuration with respect to said top surface, each of said transistors including a first region of a geometric gate construction overlying said top surface and insulated from the too surface and proximate a transistor channel region in said top surface between a transistor source region in said top surface and transistor drain region in said top surface, said gate construction forming a mesh having a plurality of substantially identical openings, each of said opening approximating a predetermined geometric shape; and subjacent each intersection of said mesh, each intersection forming a second region of the geometric gate construction overlying said top surface and insulated from the top surface proximate a third region of said top surface intervening adjacent said source regions and adjacent said drain regions of said transistors, a capacitance-reducing plug wherein said geometric gate construction is a poly-silicon structure having a first doping factor and said capacitance-reducing material is a poly-silicon layer.

7. The array as set forth in claim 6 wherein said capacitance-reducing plug is a volume of oxide.

8. The array as set forth in claim 7, wherein said volume of oxide has a geometric shape and geometric dimensions substantially conformed to the geometric shape and geometric dimensions of said intersection.

9. The array as set forth in claim 7 wherein said volume of oxide extends from a bottom surface of said gate construction into a predetermined depth of said top surface associated with source region and drain region depth measured from said top surface into said semiconductor material.

10. The array as set forth in claim 7 wherein said plug is a grown field oxidation material.

11. The array as set forth in claim 6 wherein said capacitance-reducing plug is a filled shallow trench isolation region.

12. The array as set forth in claim 6 wherein said geometric gate construction is so isolated from said top surface by a gate oxide layer and said capacitance-reducing plug is a layer of capacitance-reducing material floating in said gate oxide layer superjacent said top surface.

13. The array as set forth in claim 6 wherein said geometric gate construction is a poly-silicon structure having a first doping factor and said capacitance-reducing material is a dielectric material.

14. The array as set forth in claim 13 wherein said dielectric material is thicker greater than said geometric gate construction.

15. A cellular power MOSFET integrated circuit comprising:

a semiconductor substrate having a first ion doping type;

a surface layer of said substrate;

in said surface layer, an active element well having the first ion type doping, an array of MOSFETs including at least one row of source regions and at least one row of drain regions; superjacent said surface layer, a field isolation layer, having source and drain electrical connection vias therethrough, a poly-silicon geometric gate construction, said gate construction forming a grid having a plurality of substantially identical openings of a predetermined geometric shape and dimensions, a gate oxide layer separating said gate construction from said surface layer; and a capacitance-reducing plug at each intersection of said grid such that said plugs are inter-spaced between adjacent source regions of transistor source rows and adjacent drain regions of transistor drain rows of each row of the array wherein said plug is a dielectric floating gate construction in said gate oxide layer.

16. The invention as set forth in claim 15 wherein said plug is a relative thick field oxide.

17. The invention as set forth in claim 15 wherein said plug is a trench isolation insulator.

18. The invention as set forth in claim 15 wherein said plug is a construction formed of one or more of a relative thick field oxide, a poly-silicon floating gate construction in said gate oxide layer, and a trench isolation material.

* * * * *

UNITED STATES PATENT AND TRADEMARK OFFICE
CERTIFICATE OF CORRECTION

PATENT NO. : 6,818,950 B1
DATED : November 16, 2004
INVENTOR(S) : Mallikarjunaswamy It is certified that error appears in the above-identified patent and that said Letters Patent is hereby corrected as shown below:

Column 2,
Line 7, "uses" is changed to -- used --.
Line 10, "$E^{18}$" is changed to -- $E^{16}$ --.

Column 4,
Lines 44-45, delete the sentence "Fig. 4 depicts substantially the same embodiment in an perspective view."

Column 6,
Line 60, "too surface" is changed to -- top surface --.

Signed and Sealed this

Eighth Day of March, 2005

JON W. DUDAS
*Director of the United States Patent and Trademark Office*